United States Patent [19]

Piosenka et al.

[11] Patent Number: 5,389,738
[45] Date of Patent: Feb. 14, 1995

[54] TAMPERPROOF ARRANGEMENT FOR AN INTEGRATED CIRCUIT DEVICE

[75] Inventors: Gerald V. Piosenka, Scottsdale; David M. Harrison, Mesa; Ronald V. Chandos, Tempe, all of Ariz.

[73] Assignee: Motorola, Inc., Schaumburg, Ill.

[21] Appl. No.: 878,271

[22] Filed: May 4, 1992

[51] Int. Cl.6 ............ H01L 23/02; H01L 23/28; G08B 19/00; H04L 9/00
[52] U.S. Cl. .................. 174/52.4; 174/52.2; 361/730; 257/687; 257/783; 257/787; 340/521; 340/652; 380/3; 380/4
[58] Field of Search .......... 174/52.4, 52.2; 340/584, 598, 600, 521, 653, 651, 652; 380/3, 4, 52, 59; 361/728–730, 733–734; 257/678, 687, 782–784, 787

[56] References Cited

U.S. PATENT DOCUMENTS

| | | | |
|---|---|---|---|
| 4,421,977 | 12/1983 | Kittredge | 235/101 |
| 4,506,344 | 3/1985 | Hubbard | 364/900 |
| 4,507,744 | 3/1985 | McFiggans et al. | 364/708 |
| 4,593,384 | 6/1986 | Kleijne | 365/228 |
| 4,691,350 | 9/1987 | Kleijne | 380/3 |
| 4,811,288 | 3/1989 | Kleijne | 365/52 |
| 4,876,123 | 10/1989 | Rivera et al. | 428/34.2 |
| 5,032,708 | 7/1991 | Comerford et al. | 235/492 |
| 5,117,457 | 5/1992 | Cromerford | 380/3 |
| 5,159,629 | 10/1992 | Double | 380/4 |

Primary Examiner—Bot Ledynh
Attorney, Agent, or Firm—Frank J. Bogacz

[57] ABSTRACT

A tamperproof arrangement for an integrated circuit device. The arrangement includes a package and lid fabricated of heavy metals to prevent X-radiation or infrared detection of circuit operation. Sensors and control circuitry are located on the integrated circuit die itself which detect increased temperature and radiation and clear or zeroize any sensitive information included within the integrated circuit device. Electrode finger grids above and below the integrated circuit die detect physical attempts to penetrate the integrated circuit die. Critical circuit functions are segregated from non-critical functions. Power applied to the integrated circuit device is monitored and separated for critical and non-critical circuit functions.

16 Claims, 2 Drawing Sheets

TAMPERPROOF ARRANGEMENT FOR AN INTEGRATED CIRCUIT DEVICE

BACKGROUND OF THE INVENTION

The present invention pertains to integrated circuits and more particularly to an arrangement for preventing tampering with stored information of integrated circuits.

Modern day electronic systems have sensitive and confidential information which must be protected from unauthorized disclosure. Examples of such sensitive or confidential information include the personal identification number (PIN) or passwords in an automatic transfer machine (ATM), cryptographic keying material in a communication security (COMSEC) system, access codes in alarm systems, monetary balances in data cards, etc. This sensitive or confidential information typically resides in an integrated circuit semiconductor device, such as flip-flops and memory cells.

Some systems protect this sensitive or confidential information by sophisticated mechanical enclosures with tamper detection switches and associated circuitry. Password protected systems protect the critical or confidential information with firmware based protocols which disallow information extraction unless a proper password is presented. Such methods of protection are inadequate against skilled adversaries.

The semiconductor industry has developed sophisticated tools for semiconductor device evaluation, design validation, trouble-shooting, and fault analysis. These tools allow extraction of information such as the state of internal flip-flops by charge monitoring, circuit functions by X-rays and scanning electron microscopes, dynamic data monitoring by radiation and infrared sensing, microprobing directly onto circuit nodes, and exposing internal circuit nodes via laser drilling and ion milling.

Accordingly, it would be highly desirable to provide an arrangement for tamperproofing basic semiconductor devices at the monolithic integrated circuit level and thereby preventing data extraction of sensitive or confidential information.

SUMMARY OF THE INVENTION

In accordance with the present invention, a novel tamperproof arrangement for an integrated circuit is shown.

A tamperproof arrangement for an integrated circuit device includes an integrated circuit package and its associated lid. An integrated circuit die is affixed to the integrated circuit package by die attach material. Sensors are located throughout the integrated circuit die and integrated circuit package and lid. These sensors detect an attempt to physically or electronically tamper with critical information included in the integrated circuit die. The sensors produce a tampering signal. Responsive to this tampering signal circuitry clears or zeroizes all of the critical information included in the integrated circuit die.

A method for tamperproofing an integrated circuit device includes the following steps. Critical circuitry containing sensitive information is segregated from non-critical circuitry on the integrated circuit die. The critical circuitry is located toward the center of the integrated circuit die to protect the sensitive information from disclosure. Temperature sensors are provided on the integrated circuit die to sense changes in temperature. Radiation sensors are also provided on the integrated circuit die to sense changes in radiation level. The sensitive information is cleared if changes in the radiation level or temperature of the integrated circuit die are detected by the sensors.

DESCRIPTION OF THE PREFERRED EMBODIMENT

Figure 1:
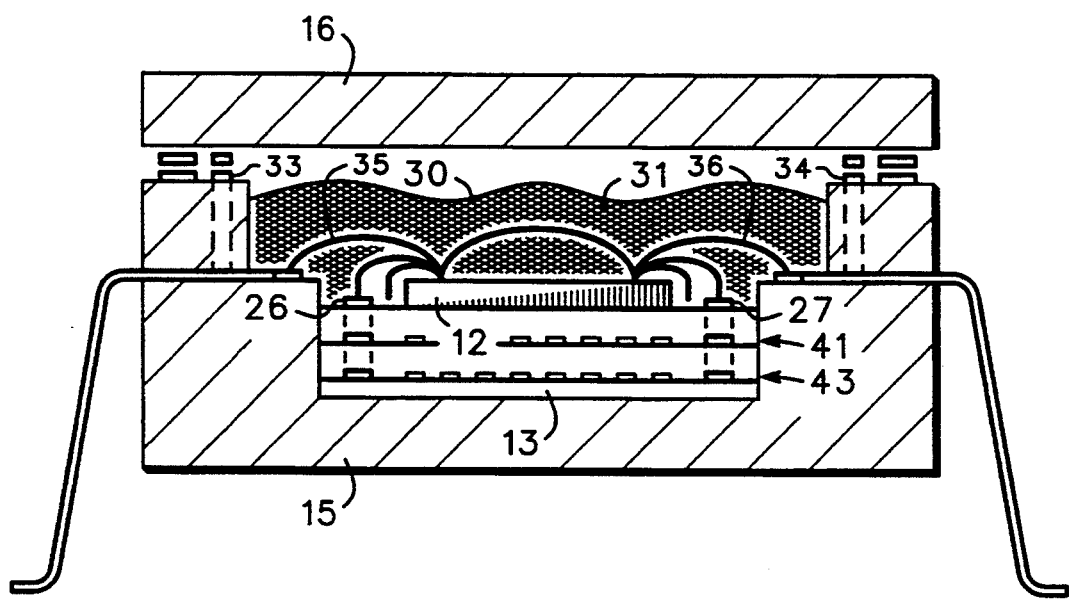
FIG. 1 is a side view of a tamperproof arrangement in accordance with the present invention.

FIG. 1 depicts a tamperproof arrangement 10 for protecting an integrated circuit semiconductor device. Integrated circuit die 12 is bonded to integrated circuit package 15 by die attachment material 13. Integrated circuit package 15 and lid 16 which forms a closure to package 15 may be made from a heavy metal such as silver or titanium. The heavy metals of the package 15 and lid 16 provide an RF shield to prohibit electromagnetic emanations from integrated circuit 12 which could result in an unwanted disclosure of information which is included in integrated circuit 12. The heavy metal of lid 16 and package 15 is a high density material which prevents information from being extracted from the integrated circuit 12 via X-ray techniques. Further, the high density, heavy metal of the package 15 and lid 16 defuses internal localized heating which can provide circuit information via infrared sensors. Further, package 15 and lid 16 serve as a radiation shield should the internal circuitry of integrated circuit 12 be subjected to nuclear radiation or ion bombardment.

Another protection mechanism is the detection of the removal of the lid 16 from the integrated circuit package 10. Sensing of a break in the conduction path from connecting point 33 to 34 would trigger the sensor within the integrated circuit and cause zeroization of sensitive or proprietary information. Multiple sensors (not shown) and multiple connections 33 and 34 can be used to elevate the probability of detection of an attack.

Further, tamperproof protection may be obtained by applying an epoxy-like conformal coating 30 over the die 12 and wire bonding areas of integrated circuit die 12 as shown in FIG. 1. This area includes the bonding pad area and connection wires from the bond pads to the die. In addition, a fine wire mesh 31 may be included in the epoxy-like conformal coating 30. The wire mesh 31 detects attempts to drill or mill through the surfaces of the package or lid. The wire mesh may be made of a continuous enamel wire conductor formed into a random-shaped three-dimensional bundle. The wire mesh 31 is not in contact with the die 12 itself or with the wire bonds or pads.

If an attempt is made to drill through or mill through the epoxy 30, it is highly certain that the conductor 31 will be severed at one or more places thereby detecting the attack upon the integrated circuit. Attempts to remove the epoxy-like material 30 will result in complete destruction of the integrated circuit die 12.

The sides an bottom of package 15 are also points of possible attack. Similar techniques as those mentioned above may be used to secure these surfaces from attack. In addition, to inhibit attacks from the sides, critical circuit nodes of the integrated circuit 12 may be placed in the center of the die thereby making direct probing more difficult. Substrate leakage detection circuitry may be applied in order to detect penetrations through the bottom of the package 15.

Figure 2:
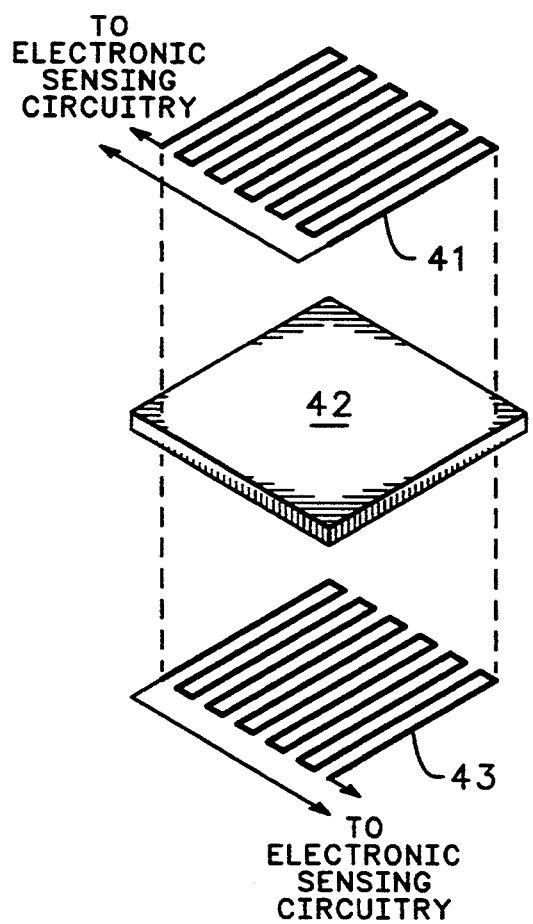
FIG. 2 is a layout of a grid portion of the tamperproof arrangement in accordance with the present invention.

Referring to FIG. 2, the details, the details for a pair of grid elements, layer 41 and 43 is shown. Dielectric layer 42 is interposed between grids 41 and 43. That is, grid 41 is placed on the top of the dielectric layer 42 and grid 43 is placed beneath dielectric layer 42. The layers of grid 41 and 43 and the dielectric 42 are integral to the semiconductor fabrication of the integrated circuit. The grid structure is fabricated from the final two metal layers for the process. For example, a 3-layer metal integrated circuit process would use metal layers 2 and 3 for the grid and the first layer is used for circuit interconnect. This approach can be extrapolated for fabrication processes that have more metal layers than three. Attempts to penetrate this grid electrode finger structure will break the conductive path or remove a significant portion of a conductor and/or change the capacity or resistance between the top and bottom grids 41 and 43. Such changes in capacitance or resistance would result from drilling or milling operations to drill through the lid 16. Detectors (not shown) on the integrated circuit 12 will detect changes in capacitance or resistance and trigger zeroizing or clearing of all sensitive or confidential information within the integrated circuit thereby rendering the integrated circuit of no use to an attacker. The sensors (not shown) on the integrated circuit 12 are connected to grids via the normal connections mechanisms for the semiconductor process. It is to be noted that the electrode fingers of grids 41 and 43 are substantially parallel so that no path to the critical circuits on integrated circuit 12 is allowed without contacting at least one of the electrodes of grids 41 and 43. Electrode finger grids in the parallel position provide a higher degree of detecting an attack than the orthogonal configuration shown infra.

Figure 3:
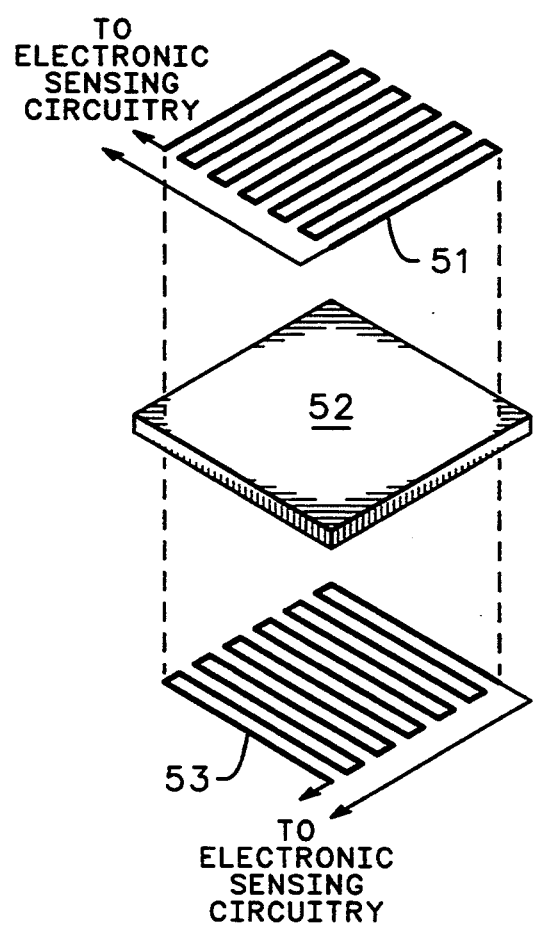
FIG. 3 is a layout of an alternate embodiment of a grid portion of the tamperproof arrangement in accordance with the present invention.

Referring to FIG. 3, an alternate embodiment of the grid arrangement is shown. Shown are electrode finger grids 51 and 53 similar to grids 41 and 43 of FIG. 2 except, the electrodes of these grids are positioned substantially orthogonal to one another. As discussed above in FIG. 2, grids 51 and 53 are positioned on the top and bottom of dielectric layer 52. The grids 51 and 53 provide for detecting an attack on the integrated circuit will penetrate at least one of the grids 51 or 53 and thereby cause the detection circuitry to sense an attack and zeroize the sensitive or proprietary information contained within the integrated circuit 12. Any breakage in this conducting path will cause the detector to detect this electrical disconnection and zeroize all the critical information. The density of the metal lid makes it difficult to use X-ray techniques to optimize the point of penetration for attacking integrated circuit 12 in order to avoid damage to the grid structures 51 and 53.

Another protection mechanism is the use of bond wires such as 35 and 36 to detect attempts to remove the integrated circuit 12 from the die attach area 13. These bonding wires 35 and 36 are connected to detector circuitry (not shown) which when triggered will erase or zeroize all the critical or confidential information on the integrated circuit 12.

Referring again to FIG. 1, further protection from attack to the semiconductor integrated circuit 12 is shown. Grids 22 and 23 are shown positioned below integrated die 12. Grids 22 and 23 comprise electrode fingers similar to those described in FIGS. 2 and 3. The electrodes of grids 22 and 23 may be positioned in a parallel fashion as described in FIG. 2 or orthogonally as described in FIG. 3.

Grids 22 and 23 are coupled to the detectors located on die 12 via contact points 26 and 27 and bonding wires 20 and 21 respectively. Grids 22 and/or 23 will detect any penetration by drilling or milling operations. The probability of striking an electrode finger and disrupting the continuity of the circuit is quite high. When discontinuity of the circuit is detected, the critical information contained within the integrated circuit 12 is zeroized or cleared.

Grids 22 and 23 are similar to those shown in FIGS. 2 and 3. Either the embodiment of FIG. 2 or FIG. 3 may be used.

Figure 4:
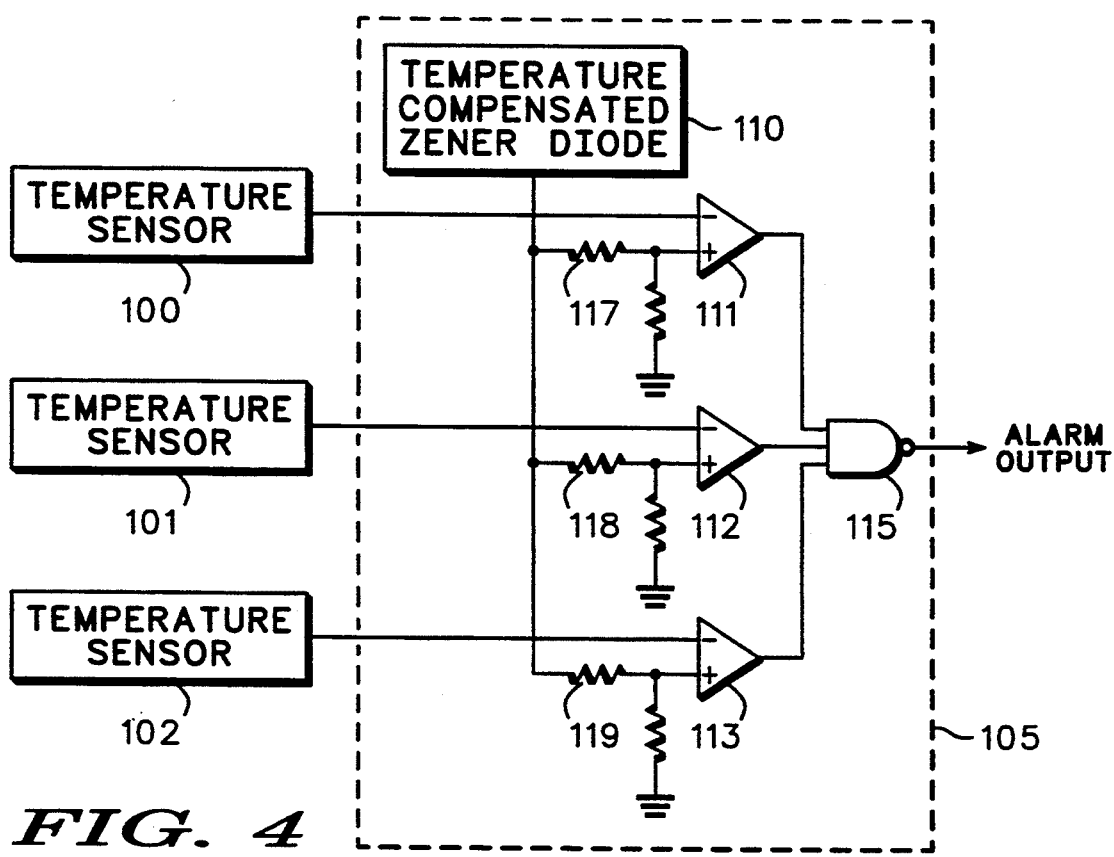
FIG. 4 is a schematic diagram of a temperature/radiation detector circuit in accordance with the present invention.

FIG. 4 is a schematic diagram of a temperature/radiation sensing circuit. The circuitry shown in FIG. 4 is implemented within the integrated circuit die 12 as shown in FIG. 1. Temperature sensors 100-102 are thermo sensitive transistor devices which produce an output voltage which is proportional to its temperature. Temperature sensors 100-102 are positioned at various random points throughout the semiconductor die so that if the semiconductor die 12 is attacked at any point, there is a likelihood that the heat generated by the attack will significantly raise the temperature of the temperature sensor 100-102. Although three temperatures are shown, for example, many more temperature sensors may be implemented in the integrated circuit die. The more sensors which are implemented, the greater the likelihood of detection of an attack.

Temperature sensors 100, 101, and 102 are respectively coupled to operational amplifiers/comparators 111, 112, and 113 respectively. Temperature compensated zener diode is coupled through resistors 117, 118, and 119 to comparators 111, 112, and 113 respectively. Temperature compensated zener diode provides a reference voltage for application to each of the comparators 111-113 in order to detect a voltage from the respective temperature sensor 100-102 which is increased due to a proportional increase in temperature. Resistors 117-119 may be chosen to set the level for triggering comparators 111-113. The values of resistors 117-119 will also be a function of the particular kind of technology used to implement the temperature/radiation sensors and comparators. Such technologies include but are not limited to CMOS, bipolar, and ECL.

The output of each of the comparators 111-113 is coupled to NAND gate 115. NAND 115 provides an alarm output if at least one of the sensors 100-102 indicates an increase in temperature or radiation level.

In operation, sensors 100-102 produce a voltage proportional to the temperature sensed by the temperature sensor transistor 100-102. Temperature compensated zener diode provides a reference voltage through resistors 117-119 to comparators 111-113. Comparators 111-113 constantly monitor the voltage output of sensors 100-102 and compare this output to the reference voltage of the zener diode 110. If temperature sensors 100-102 detect an increase in temperature an increased voltage is produced and transmitted to the appropriate comparator 111–113. As the voltage output from sensors 100–102 increase, this voltage will exceed the reference voltage of the zener diode 110 and cause the output of comparators 111–113 to change state and output a logic zero signal which will produce a logic one as the alarm output of NAND gate 115. As a result, other circuitry (not shown) will zeroize all the critical information included in the integrated circuit. Temperature sensors 100–102 may be located at various randomly selected places within the integrated circuit die so that temperatures may be monitored at various places. In addition, the circuit of FIG. 4 may be replicated so that large areas of the integrated circuit die may be protected by sensing increased temperature.

Further, sensors 100–102 may comprise radiation sensors. There radiation sensors are also transistors which are included as part of the integrated circuit die itself. The radiation sensors produce a current that is proportional to the intensity of the particle bombardment detected by the integrated sensor. In such cases, the temperature compensated zener diode 110 may be replaced with a constant current source, so that comparators 111–113 may operate as described above for an increased current output by sensors 100–102. For either radiation sensors or temperature sensors 100–102, if any of the sensors detect an increase in temperature or radiation levels, an alarm output is produced by NAND gate 115 which indicates that the critical information is to be cleared or zeroized.

Figure 5:
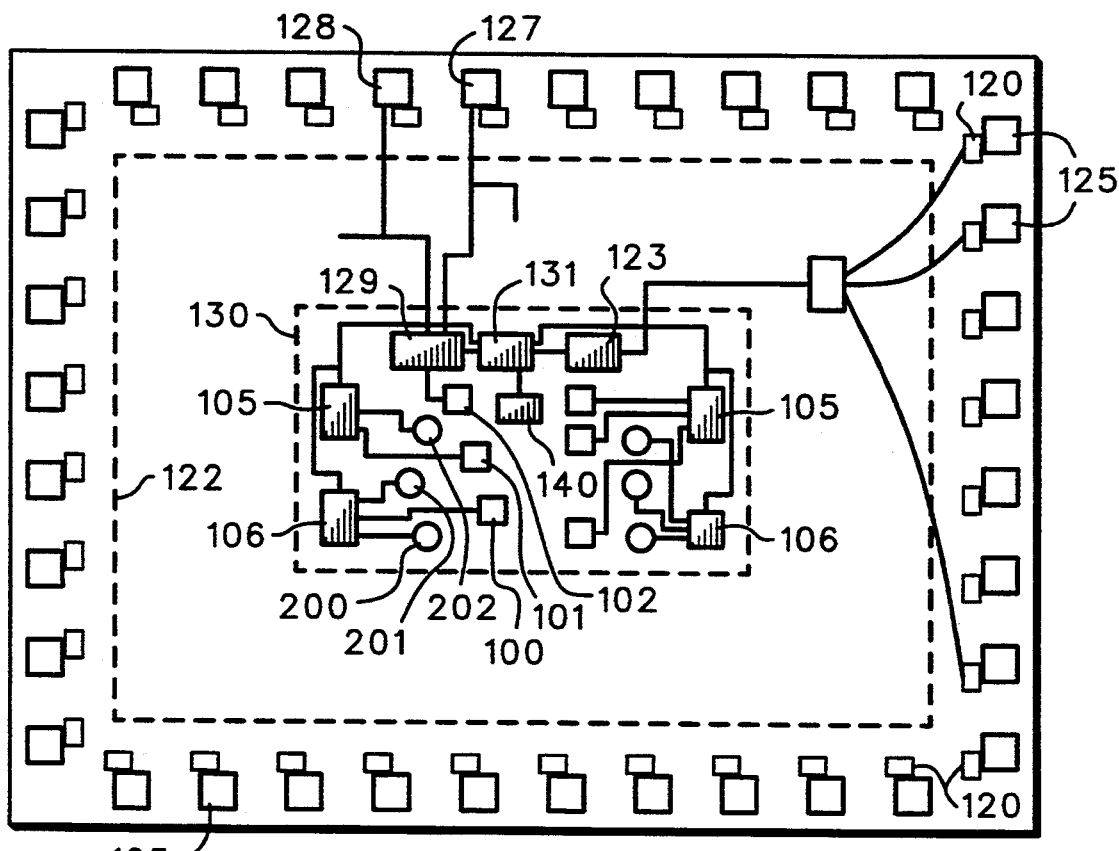
FIG. 5 is a layout of a semiconductor die in accordance with the present invention.

Referring to FIG. 5, a semiconductor die layout is shown. The semiconductor die is item 12 in FIG. 1. Integrated circuit die 12 includes a series of bonding pads 125 located about the perimeter of the integrated circuit die 12. Input/output connections are made from both the non-critical circuit functions area 122 and the critical circuit functions area 130 to bonding pads 125. Bonding pads 125 are connected external input/output pins which provide for data and power into and out of integrated circuit 12. Coupled to each of the bonding pads 125 on die 12 are circuits 120 to prevent critical information being latched up by the application of excessive power to the integrated circuit. Such circuits 120 are coupled to each of the bonding pads 125 and may include fusible links set to disconnect if a certain voltage threshold is achieved or diode clamp and resistor circuits to inhibit the application of excess voltage. Each of the circuits 120 are connected to control circuit 121 which provides an indication to control circuit 123 for clearing all the information included in the critical circuit functions area 130. Control circuit 123 is coupled to energy storage device 131 which can be implemented via a monolithic capacitor. Energy storage device 131 has a small amount of power so that upon the detection of an attack to the integrated circuit, this power is applied to all memory elements to clear or zeroize them to prevent the disclosure of any sensitive information.

The integrated circuit power and ground leads and bonding pads 127 and 128 respectively provide a point of attack by which the integrated circuit 12 may be latched up to determine the sensitive information. Power conditioning circuit 129 provides for separating the power and ground leads which are used for the critical circuit functions area 130 from the power and ground applied to the non-critical circuit functions 122. In this way if there is an attempt to apply excessive power or to remove power and ground from the critical circuit functions 130, such attempt will be detected by power conditioning circuit 129. Power conditioning circuit 129 will then trigger energy storage device 131 to clear or zeroize all of the critical information in the critical circuit function area 130. Control circuit 123, energy storage device, and power conditioning circuit 129 are located within the critical circuit functions area 130.

Comparators 105 are also located within the critical circuit function area 130. Comparators 105 are shown in FIG. 4. Temperature sensors 100–102 and others each designated as a square within the critical circuit function area 130 are coupled to comparators 105. Radiation sensors 200–202 and others designated as small circles are coupled to radiation sensors 106. The radiation sensors 200–202 and temperature sensors 100–102 are randomly placed throughout the critical circuit function area 130. This will increase the probability of detection of attack by drilling or milling operations. Although six of each kind of temperature sensor 100–102 and radiation sensor 200–202 is shown, many more sensors may be employed. The configuration is not limited to six of each kind of sensor.

Each comparator circuit 105 and 106 is coupled to the energy storage device 131. If an alarm output is generated by any of the comparator circuits, this alarm output is transmitted to energy storage device 131. Energy storage device 131 then clears or zeroizes all the critical or sensitive information included within critical circuit function area 130. As a result, integrated circuit 12 is protected from any kind of attack which would be accomplished via radiation or which would generate heat over and above the normal operating temperature of the integrated circuit 12.

The above tamper detection arrangements and associated clearing of sensitive information retained within an integrated circuit provide a monolithic solution to tamperproofing integrated circuits. Each of the tamper protection devices is included on the integrated circuit or the package which houses the integrated circuit. Thereby a higher degree of tamperproof protection is provided due to the minimization of the physical area required for protection. In addition, no external integrated circuits or devices are required. In addition, the packaging portion of the tamperproof arrangement considerably reduces radiation to inhibit circuit protection by an attacker. Each of the sensors and detectors is located on the integrated circuit and is constructed utilizing the same manufacturing process to provide the circuit elements themselves. This provides considerably cost reduction and less components while at the same time providing for increased tampering detection from physical, electronic, or radiation-type sources.

As a result, integrated circuits with the above-described tamperproof arrangement are suitable for use as smart cards in banking to retain balances and credit limits, in cryptographic communication systems to retain the crypto key, and secure microprocessors to inhibit disclosure of associated firmware or microcode within the microprocessor.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A tamperproof arrangement for an integrated circuit device comprising:

an integrated circuit package including a lid for sealing said integrated circuit package;

an integrated circuit die including an integrated circuit for providing electronic circuitry;

die attach material for bonding said integrated circuit die to said integrated circuit package;

means for detecting a physical attack of said integrated circuit;

means responsive to said means for detecting for clearing critical information from said integrated circuit;

said means for detecting including:

at least two metal conductor grids located only underneath said integrated circuit, said conductor grids for detecting damage to said integrated circuit and providing an indication to said means responsive for clearing said critical information; and a dielectric layer interposed between electrode fingers of said two metal conductor grids, in response to damage of said dielectric layer, said dielectric layer indicating a change in capacitance, said means responsive operating to clear said critical information in response to said change in capacitance.

2. A tamperproof arrangement for an integrated circuit device as claimed in claim 1, wherein there is further included a conformal epoxy coating disposed over said integrated die to render said integrated circuit die impervious to said physical attack.

3. A tamperproof arrangement for an integrated circuit device as claimed in claim 2, wherein there is further included:

a three-dimensional insulated conductor bundle embedded in said epoxy compound, said insulated conductor bundle coupled to said means responsive for indicating to said means responsive whether said insulated conductor bundle has been damaged indicating an attack upon the integrated circuit; and said means responsive to said damage of said insulated conductor bundle to clear said critical information of said integrated circuit die.

4. A tamperproof arrangement for an integrated circuit device as claimed in claim 1, wherein there is further included a three-dimensional insulated conductor bundle disposed over said integrated circuit die, said insulated conductor bundle being coupled to said means responsive and for indicating to said means responsive whether said insulated conductor bundle has been damaged indicating an attack upon the integrated circuit die.

5. A tamperproof arrangement for an integrated circuit device as claimed in claim 1, wherein said electrode fingers of said at least two conductor grids include electrode fingers having a pitch of approximately 4 microns.

6. A tamperproof arrangement for an integrated circuit device as claimed in claim 5, wherein said two metal conductor grids are positioned so that said electrode fingers of said two metal conductor grids are substantially parallel.

7. A tamperproof arrangement for an integrated circuit device as claimed in claim 5, wherein said two metal conductor grids are positioned so that said electrode fingers are substantially orthogonal.

8. A tamperproof arrangement for an integrated circuit device as claimed in claim 1, wherein said integrated circuit package and said lid comprise a heavy metal.

9. A tamperproof arrangement for an integrated circuit device as claimed in claim 8, wherein said heavy metal comprises silver.

10. A tamperproof arrangement for an integrated circuit device as claimed in claim 8, wherein said heavy metal comprises titanium.

11. A tamperproof arrangement for an integrated circuit device as claimed in claim 1, wherein said means for detecting further includes contact points affixed to said integrated circuit package and said lid, said contact points being normally placed in contact with one another to form a continuous electric circuit, said contact points providing an indication of a removal of said lid from said integrated circuit package, said means responsive to said indication of removal of said lid from said integrated circuit package to clear said critical information of said integrated circuit die.

12. A tamperproof arrangement for an integrated circuit device as claimed in claim 1, said means for detecting further including:

sensor means located on said integrated circuit die, said sensor means detecting changes in temperature of said integrated circuit die and providing an indication proportional to said changes;

reference means for providing a threshold temperature indication;

comparing means coupled to said sensor means and to said reference means, said sensor means operating to determine whether said indication proportional to said changes in said temperature exceeds said threshold temperature indication and producing a first signal in response; and indicating means coupled to said comparing means, said indicating means responsive to said first signal to produce an alarm signal indicating that said integrated circuit is being attacked.

13. A tamperproof arrangement for an integrated circuit device as claimed in claim 12, wherein said sensor means includes temperature sensor means for providing an output voltage proportional to a temperature of said integrated circuit die; and said reference means providing a threshold voltage.

14. A tamperproof arrangement for an integrated circuit device as claimed in claim 12, wherein said sensor means further includes radiation sensor means located on said integrated circuit die, said radiation means providing an electrical current proportional to the level of radiation of said integrated circuit die; and said reference means providing a threshold current.

15. A tamperproof arrangement for an integrated circuit device as claimed in claim 12, wherein said means responsive includes:

control circuit means located on said integrated circuit, said control means coupled to said indicating means and responsive to said alarm signal to produce a control signal;

at least one memory element including said critical information; and power means located on said integrated circuit and coupled to said control circuit means and to said at least one memory element, said power means operating in response to said control signal to clear said at least one memory element.

16. A tamperproof arrangement for an integrated circuit device as claimed in claim 15, wherein there is further included:

bonding pads located on said integrated circuit die for coupling inputs and outputs to and from said integrated circuit, to and from external connections;

said means for detecting further including voltage detection means coupled to said bonding pads, said voltage detection means for detecting an over or under voltage application from said external connections to said bonding pads;

generation means coupled to said voltage detection means, said generation means providing a second alarm signal in response to said voltage detection means detecting an over or under voltage condition; and said control circuit means operating in response to said second alarm signal to clear said critical information of said at least one memory element.

* * * * *